United States Patent
Nakajima

(10) Patent No.: US 8,913,429 B2
(45) Date of Patent: Dec. 16, 2014

(54) NONVOLATILE SEMICONDUCTOR MEMORY DEVICE

(75) Inventor: Yasushi Nakajima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 13/370,661

(22) Filed: Feb. 10, 2012

(65) Prior Publication Data

US 2012/0206965 A1      Aug. 16, 2012

(30) Foreign Application Priority Data

Feb. 10, 2011   (JP) ................................. 2011-026785

(51) Int. Cl.
  *G11C 11/34*      (2006.01)
  *G11C 16/34*      (2006.01)
(52) U.S. Cl.
  CPC .................................. *G11C 16/3445* (2013.01)
  USPC ............. 365/185.11; 365/185.29; 365/185.22
(58) Field of Classification Search
  CPC ..... G11C 16/16; G11C 11/5635; G11C 16/18
  USPC ............................. 365/185.22, 185.29, 185.11
  See application file for complete search history.

(56) References Cited

U.S. PATENT DOCUMENTS 5,708,605 A * 1/1998 Sato .......................... 365/185.29

FOREIGN PATENT DOCUMENTS

| JP | 6-28899 | 2/1994 |
|---|---|---|
| JP | 6-259978 A | 9/1994 |
| JP | 8-87894 | 4/1996 |
| JP | 9-91979 | 4/1997 |
| JP | 2001-273792 | 10/2001 |
| WO | WO 2009145923 A1 * | 12/2009 |

OTHER PUBLICATIONS

Office Action issued Jul. 2, 2013, in Japanese Patent Application No. 2011-026785.

* cited by examiner

*Primary Examiner* — Toan Le
*Assistant Examiner* — Ajay Ojha
(74) *Attorney, Agent, or Firm* — Oblon, Spivak, McClelland, Maier & Neustadt, L.L.P.

(57) ABSTRACT

According to one embodiment, an erase verification execution unit that makes an erase verify operation of a memory cell, on which an erase operation is performed, to be performed, a number-of-erase-verifications counting unit that counts the number of erase verifications of a memory cell on which the erase operation is performed, and a number-of-erase-verifications setting unit that sets a minimum number of erase verifications for the next time based on the current number of erase verifications counted by the number-of-erase-verifications counting unit are included.

19 Claims, 11 Drawing Sheets

US 8,913,429 B2

NONVOLATILE SEMICONDUCTOR MEMORY DEVICE

CROSS-REFERENCE TO RELATED APPLICATIONS

This application is based upon and claims the benefit of priority from Japanese Patent Application No. 2011-26785, filed on Feb. 10, 2011; the entire contents of which are incorporated herein by reference.

FIELD

Embodiments described herein relate generally to a nonvolatile semiconductor memory device.

BACKGROUND

In NAND-type flash memories, an erase operation is performed collectively in a block unit in some cases. At this time, an erase verify operation is performed in some cases for checking whether erasing of all of memory cells is completely performed. Then, in an erase verify operation, when it is checked that erasing of all of memory cells is not normally performed, an erase operation is repeatedly performed until erasing of all of memory cells is completely performed.

DETAILED DESCRIPTION

In general, according to a nonvolatile semiconductor memory device in embodiments, a memory cell array, an erase execution unit, an erase verification execution unit, a number-of-erase-verifications counting unit, and a number-of-erase-verifications setting unit are included. In the memory cell array, a plurality of memory cells is provided. The erase execution unit makes an erase operation of data stored in the memory cells to be performed. The erase verification execution unit makes an erase verify operation of a memory cell, on which the erase operation is performed, to be performed. The number-of-erase-verifications counting unit counts the number of erase verifications of a memory cell on which the erase operation is performed. The number-of-erase-verifications setting unit sets a minimum number of erase verifications for the next time based on the current number of erase verifications counted by the number-of-erase-verifications counting unit.

A nonvolatile semiconductor memory device according to the embodiments will be explained below with reference to the drawings. The present invention is not limited to these embodiments.

(First Embodiment)

Figure 1:
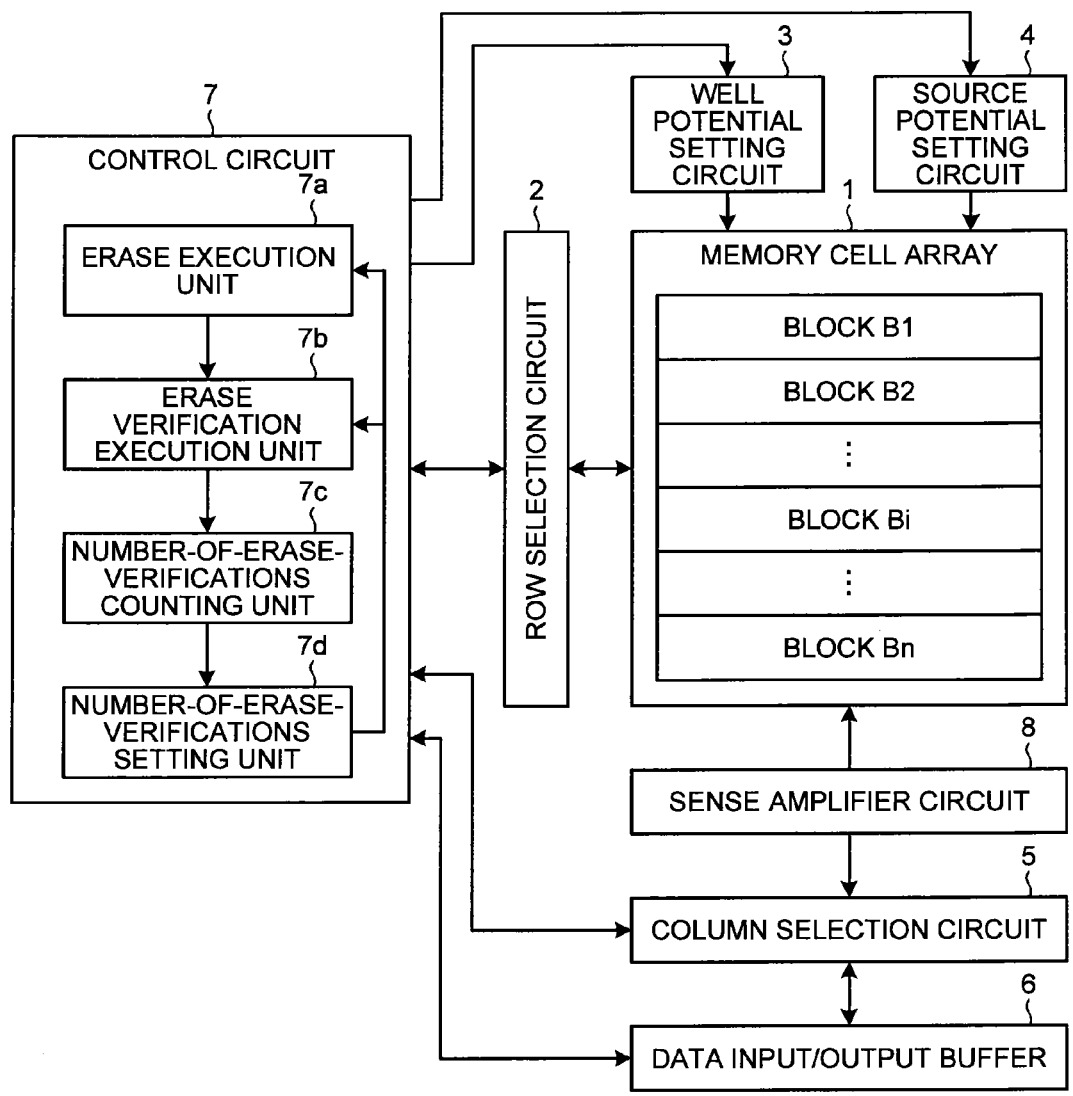
FIG. 1 is a block diagram illustrating a schematic configuration of a nonvolatile semiconductor memory device according to a first embodiment.

FIG. 1 is a block diagram illustrating a schematic configuration of a nonvolatile semiconductor memory device according to the first embodiment. In the following embodiment, a NAND-type flash memory is exemplified as the nonvolatile semiconductor memory device.

In FIG. 1, this nonvolatile semiconductor memory device includes a memory cell array 1, a row selection circuit 2, a well potential setting circuit 3, a source potential setting circuit 4, a column selection circuit 5, a data input/output buffer 6, a control circuit 7, and a sense amplifier circuit 8.

In the memory cell array 1, memory cells that store data are arranged in a matrix manner in a row direction and a column direction. One memory cell may store one bit of data or may perform multi-value recording to store two or more bits of data.

The memory cell array 1 is divided into n (n is a positive integer) number of blocks B1 to Bn. Each of the blocks B1 to Bn can be configured by arraying a plurality of NAND cell units in the row direction.

Figure 2:
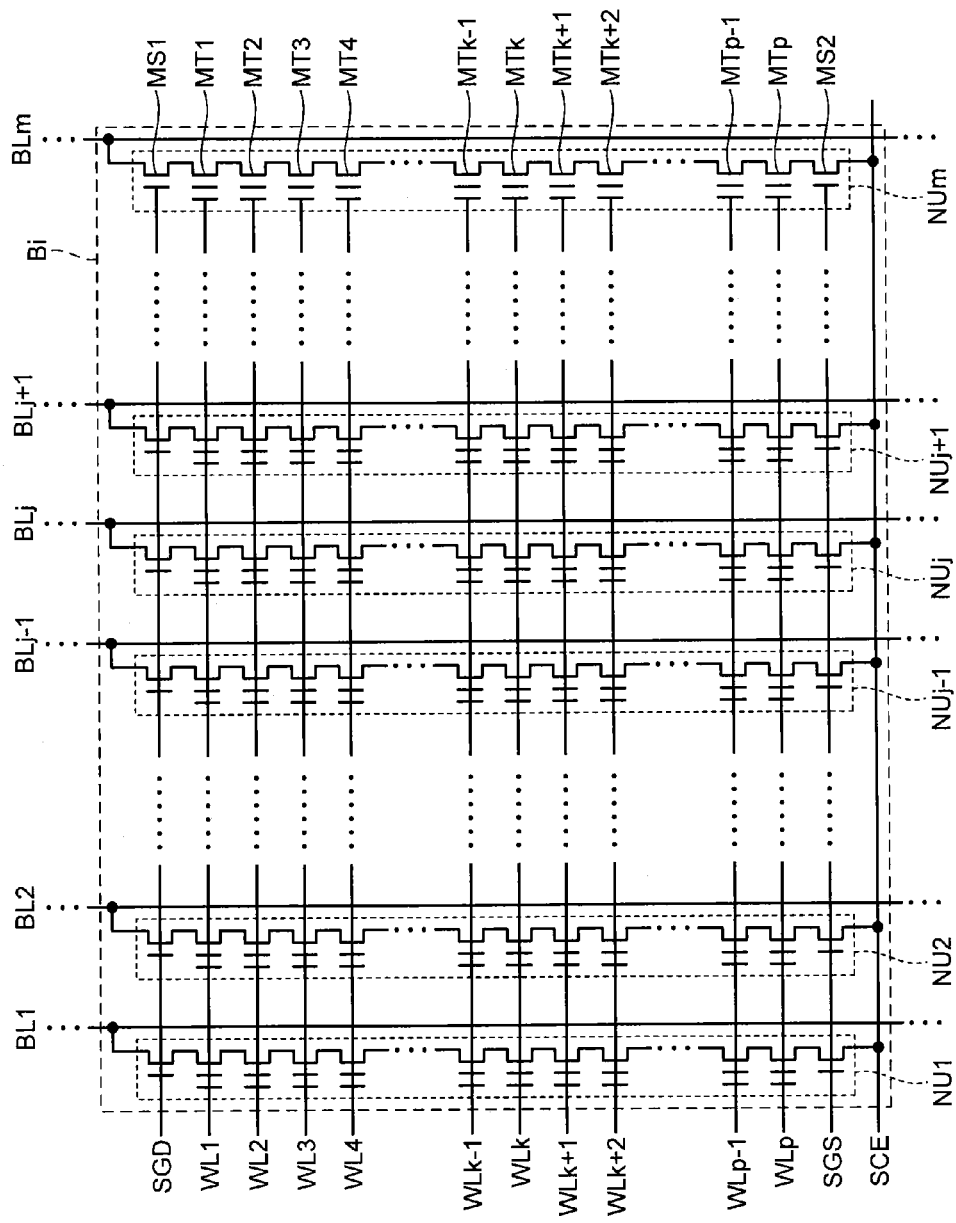
FIG. 2 is a circuit diagram illustrating a schematic configuration of blocks of the nonvolatile semiconductor memory device in FIG. 1.

FIG. 2 is a circuit diagram illustrating the schematic configuration of the blocks of the nonvolatile semiconductor memory device in FIG. 1.

In FIG. 2, in the block Bi (integer satisfying $1 \leq i \leq n$), p (p is a positive integer) number of word lines WL1 to WLp, select gate lines SGD and SGS, and a source line SCE are provided. Moreover, in the blocks B1 to Bn, m (m is a positive integer) number of bit lines BL1 to BLm are provided in common.

In the block Bi, m number of NAND cell units NU1 to NUm are provided, and the NAND cell units NU1 to NUm are arrayed in the row direction to be adjacent to each other.

In each of the NAND cell units NU1 to NUm, p number of cell transistors MT1 to MTp and select transistors MS1 and MS2 are provided. In one memory cell of the memory cell array 1, one cell transistor MTk (integer satisfying $p \leq k \leq 1$) is provided. A NAND string is configured by connecting p number of the cell transistors MT1 to MTp in series. In the NAND cell unit NUj (integer satisfying $1 \leq j \leq m$), a NAND string and the select transistors MS1 and MS2 connected to both ends of the NAND string are provided.

Then, in the NAND cell units NU1 to NUm, the word lines WL1 to WLp are connected to the control gate electrodes of the cell transistors MT1 to MTp, respectively. Moreover, in the NAND cell unit NUj, one end of the NAND string of the cell transistors MT1 to MTp is connected to the bit line BLj via the select transistor MS1 and the other end of the NAND string is connected to the source line SCE via the select transistor MS2.

Moreover, in FIG. 1, at the time of reading, writing, and erasing of a memory cell, the row selection circuit 2 can select a memory cell in the row direction in the memory cell array 1. At the time of reading, writing, and erasing of a memory cell, the well potential setting circuit 3 can set a well potential of the memory cell array 1. At the time of reading, writing, and erasing of a memory cell, the source potential setting circuit 4 can set a source potential of the memory cell array 1. At the time of reading, writing, and erasing of a memory cell, the column selection circuit 5 can select a memory cell in the column direction of the memory cell array 1. The sense amplifier circuit 8 can determine data read out from a memory cell for each column. The data input/output buffer 6 can send a command or an address received from outside to the control circuit 7 and perform reception and transmission of data between the sense amplifier circuit 8 and the outside.

The control circuit 7 can control operations of the row selection circuit 2, the well potential setting circuit 3, the source potential setting circuit 4, and the column selection circuit 5 based on a command and an address. The control circuit 7 includes an erase execution unit 7a, an erase verification execution unit 7b, a number-of-erase-verifications counting unit 7c, and a number-of-erase-verifications setting unit 7d.

The erase execution unit 7a can make an erase operation of data stored in memory cells of the memory cell array 1 to be performed. The erase verification execution unit 7b can make an erase verify operation of memory cells, on which an erase operation is performed, to be performed. The number-of-erase-verifications counting unit 7c can count the number of erase verifications of memory cells on which an erase operation is performed. The number-of-erase-verifications setting unit 7d can set the minimum number of erase verifications from the next time based on the current number of erase verifications counted by the number-of-erase-verifications counting unit.

Then, when an erase operation of the block Bi is performed, 0 V is applied to the word lines WL1 to Wl of the block Bi and the well potential of the memory cell array 1 is set to an erase voltage Ve. For example, the erase voltage Ve can be set to 17 V. Moreover, the source line SCE and the select gate lines SGD and SGS of the block Bi can be set to a floating state.

Figure 3:
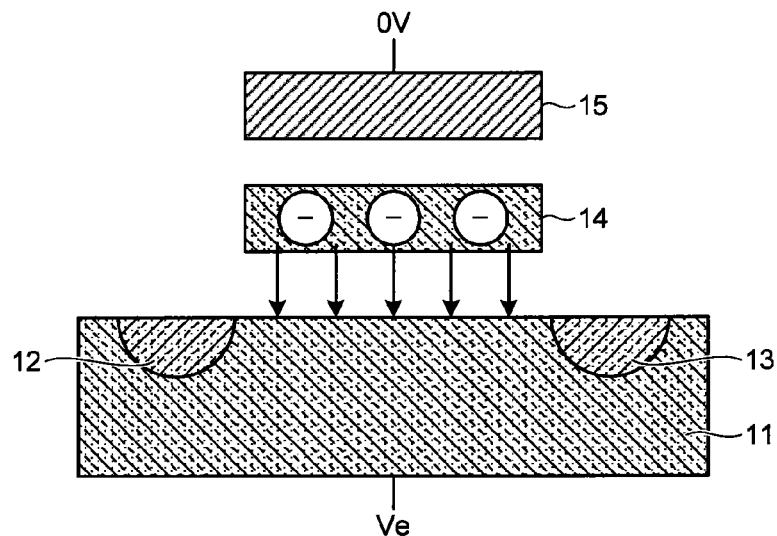
FIG. 3 is a cross-sectional view for one cell illustrating an erase operation of the nonvolatile semiconductor memory device in FIG. 1.

FIG. 3 is a cross-sectional view for one cell illustrating an erase operation of the nonvolatile semiconductor memory device in FIG. 1.

In FIG. 3, a floating gate electrode (charge storage layer) 14 is arranged on a well 11 and a control gate electrode 15 is arranged on the floating gate electrode 14. The well 11 and the floating gate electrode 14 can be insulated from each other via a not-shown tunnel dielectric film. The floating gate electrode 14 and the control gate electrode 15 can be insulated from each other via a not-shown inter-electrode dielectric film.

Then, source and drain 12 and 13 arranged on both sides of the floating gate electrode 14 are formed in the well 11. For example, a P-type well region can be used for the well 11 and an N-type impurity diffusion layer can be used for the source and drain 12 and 13.

Then, when 0 V is applied to the word lines WL1 to WLp of the block Bi and the well potential of the memory cell array 1 is set to the erase voltage Ve, a high voltage is applied between the well 11 and the control gate electrode 15 of a memory cell of the block Bi. Therefore, electrons charged in the floating gate electrode 14 are discharged to the well 11 side and an erase operation of the memory cell of the block Bi is performed.

When an erase operation of the memory cells of the block Bi is performed, an erase verify operation is performed to check whether erasing is completely performed. At this time, 0 V is applied to the word lines WL1 to WLp of the block Bi, a read voltage Vsg is applied to the select gate lines SGD and SGS, and a power supply voltage VDD is applied to the source line SCE. The well potential of the memory cell array 1 is set to the erase voltage Ve. The read voltage Vsg is voltage sufficient for turning on the select transistors MS1 and MS2.

Figure 4:
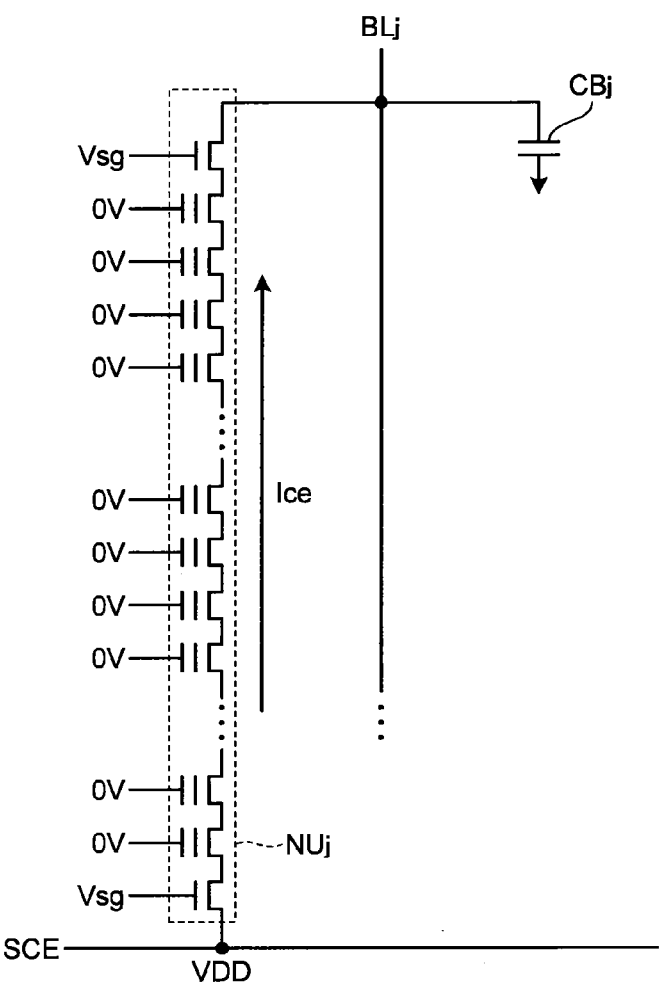
FIG. 4 is a circuit diagram for one cell unit illustrating an erase verify operation of the nonvolatile semiconductor memory device in FIG. 1.

FIG. 4 is a circuit diagram for one cell unit illustrating an erase verify operation of the nonvolatile semiconductor memory device in FIG. 1.

In FIG. 4, a parasitic capacitance CBj is added to the bit line BLj. If the threshold voltage of the cell transistors MT1 to MTp becomes 0 V or lower as a result of performing an erase operation of the cell transistors MT1 to MTp of the NAND cell unit NUj, a cell current Ice flows at the time of an erase verify operation and the parasitic capacitance CBj is charged. At this time, the potential of the bit line BLj depends on the threshold voltage of the least erased cell transistors MT1 to MTp. Then, the potential of the bit line BLj at this time is compared with an erase verification voltage Vf, and when the potential of the bit line BLj is the erase verification voltage Vf or more, it is determined that erasing of the cell transistors MT1 to MTp is completely performed, and when the potential of the bit line BLj is less than the erase verification voltage Vf, it is determined that erasing of the cell transistors MT1 to MTp is incomplete.

Then, when it is determined that erasing of the cell transistors MT1 to MTp is incomplete, an erase operation of the memory cells of the block Bi is repeated.

Figure 5:
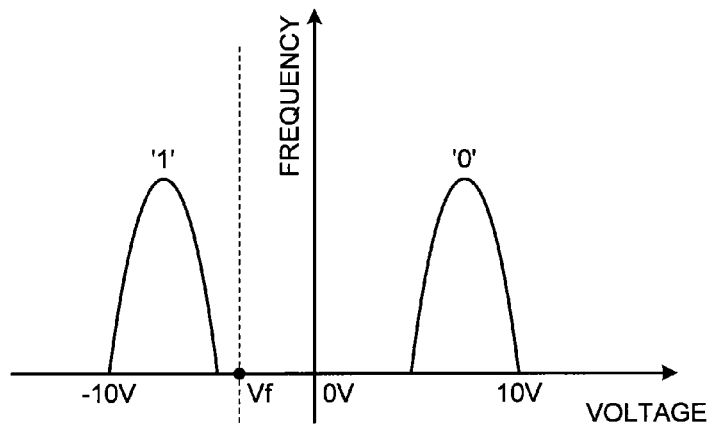
FIG. 5 is a diagram illustrating a threshold voltage distribution of a memory cell at the time of erasing and writing of the nonvolatile semiconductor memory device in FIG. 1.

FIG. 5 is a diagram illustrating a threshold voltage distribution of a memory cell at the time of erasing and writing of the nonvolatile semiconductor memory device in FIG. 1.

In FIG. 5, '0' is stored in a memory cell in a write operation and '1' is stored in a memory cell in an erase operation. When '0' is stored in a memory cell, the threshold voltage of the cell transistors MT1 to MTp becomes larger than 0 V. Therefore, even if 0 V is applied to the word lines WL1 to WLp of the block Bi, current does not flow in the cell transistors MT1 to MTp. On the other hand, when '1' is stored in a memory cell, the threshold voltage of the cell transistors MT1 to MTp becomes smaller than 0 V. Therefore, when 0 V is applied to the word lines WL1 to WLp of the block Bi, current flows in the cell transistors MT1 to MTp. At this time, when erasing of the cell transistors MT1 to MTp of the NAND cell unit NUj is completely performed, the threshold voltage of all of the cell transistors MT1 to MTp becomes equal to or less than the erase verification voltage Vf that is the upper limit of the tolerance of the threshold voltage distribution.

In the number-of-erase-verifications counting unit 7c in FIG. 1, the number of erase verifications of memory cells, on which an erase operation is performed, is counted. Then, in the number-of-erase-verifications setting unit 7d, the current number of erase verifications counted by the number-of-erase-verifications counting unit 7c is set as the minimum number of erase verifications from the next time.

Then, in the erase execution unit 7a and the erase verification execution unit 7b, even when there are memory cells that pass an erase verification in the number of times less than the number of erase verifications set by the number-of-erase-verifications setting unit 7d, an erase operation and an erase verify operation are performed for the number of erase verifications set by the number-of-erase-verifications setting unit 7d.

Consequently, even when memory cells are determined to pass an erase verification check at the time of an erase verify operation despite the fact that erasing of the cell transistors MT1 to MTp is incomplete, an erase operation and an erase verify operation can be performed for the largest number of erase verifications ever performed. Therefore, even when the number of erase verifications increases with degradation of a tunnel oxide film or the like, erase failure can be reduced while suppressing increase in stress at the time of erasing.

Figure 6:
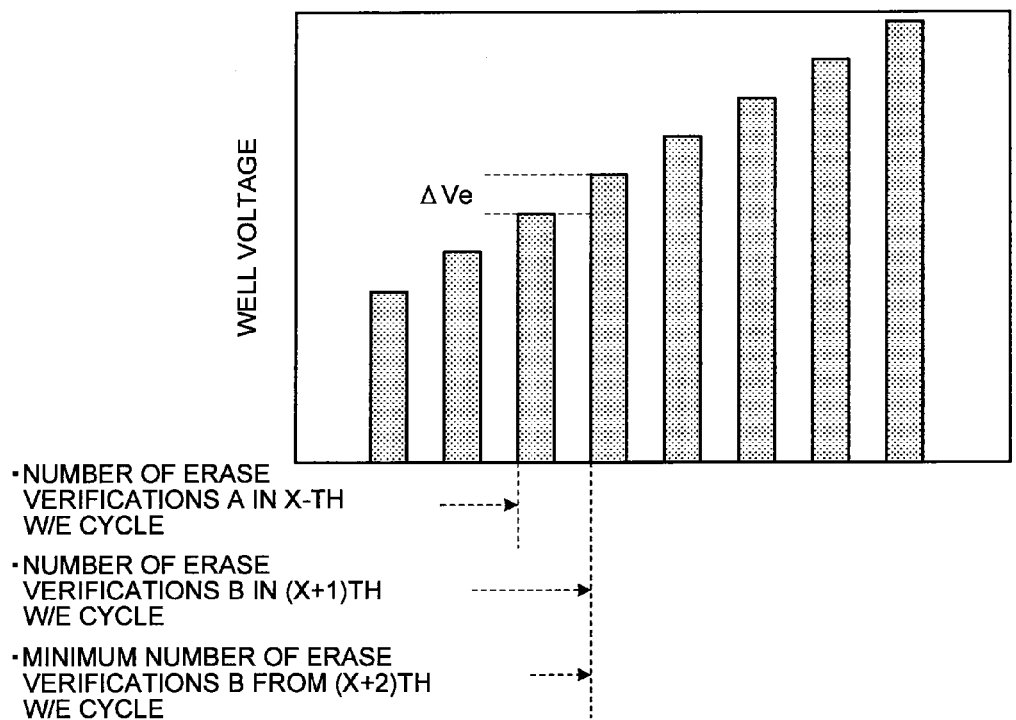
FIG. 6 is a diagram illustrating a relationship between the number of erase verifications and a well voltage of the nonvolatile semiconductor memory device in FIG. 1.

FIG. 6 is a diagram illustrating a relationship between the number of erase verifications and a well voltage of the nonvolatile semiconductor memory device in FIG. 1.

In FIG. 6, when an erase operation of the block Bi in FIG. 1 is performed, an erase verify operation is performed. Then, when it is determined that current erasing is incomplete in the erase verify operation, the next erase operation is performed after increasing the erase voltage Ve by a difference voltage ΔVe.

When the number of erase verifications in the X-th (X is a positive integer) write/erase cycle is A (A is a positive integer) and the number of erase verifications in the (X+1)th write/erase cycle is B (B is an integer larger than A), the minimum number of erase verifications from the (X+2)th write/erase cycle is set to B.

Figure 7:
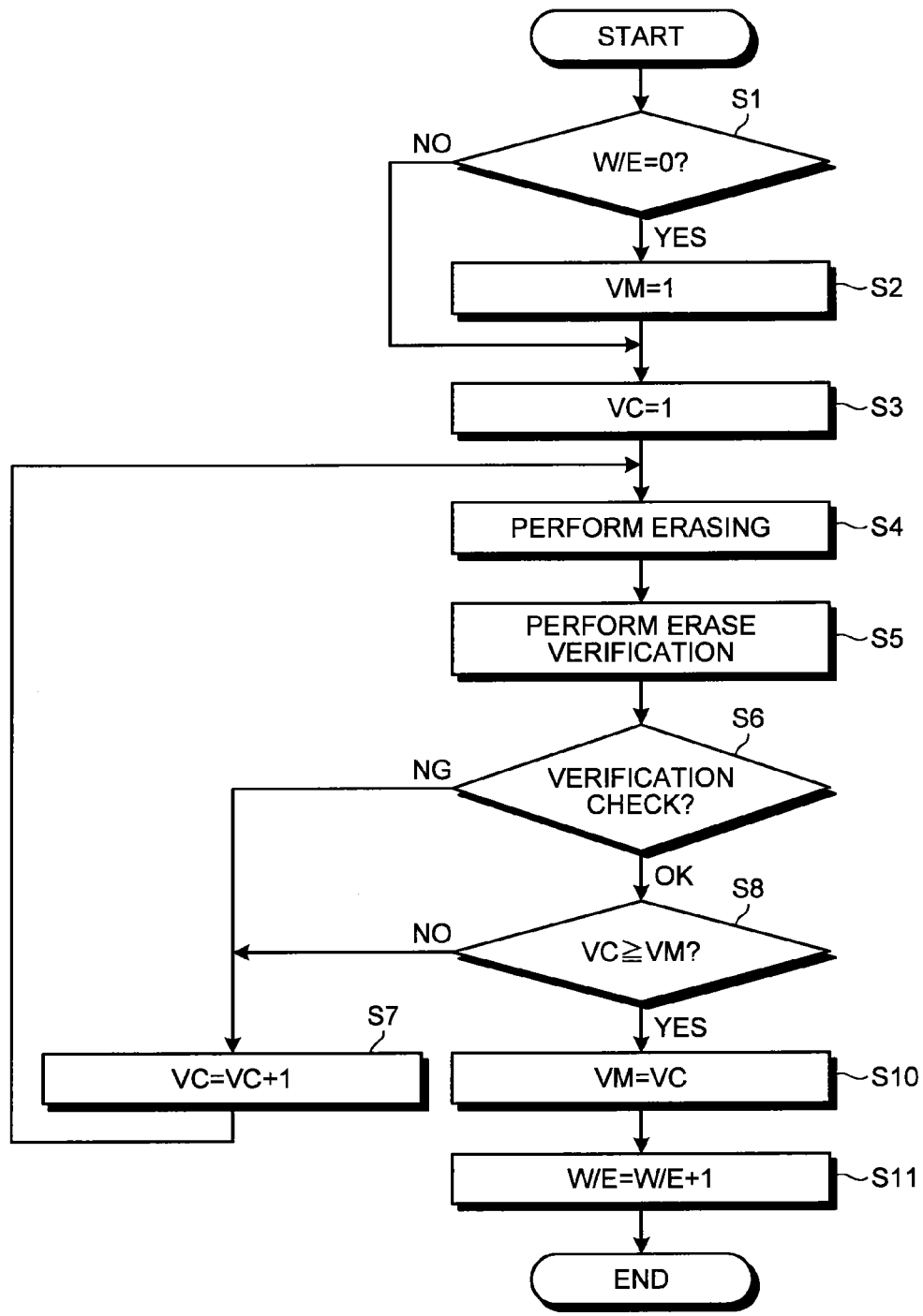
FIG. 7 is a flowchart illustrating an erase verify operation of the nonvolatile semiconductor memory device in FIG. 1.

FIG. 7 is a flowchart illustrating an erase verify operation of the nonvolatile semiconductor memory device in FIG. 1.

In FIG. 7, when the number of writes/erasures W/E is 0 (S1), after the predetermined number of erase verifications VM is set to 1 (S2), the number of executions of an erase verification VC is set to 1 (S3). On the other hand, when the number of writes/erasures W/E is 1 or more (S1), the number of executions of an erase verification VC is set to 1 (S3).

Next, after an erase operation of the block Bi in FIG. 1 is performed by using the erase execution unit 7a (S4), an erase verify operation is performed by using the erase verification execution unit 7b (S5). Then, in the case of passing an erase verification check (S6), the number of executions of an erase verification VC is compared with the predetermined number of erase verifications VM. Then, when the number of executions of an erase verification VC is equal to or more than the predetermined number of erase verifications VM (S8), after the number of executions of an erase verification VC is set to the predetermined number of erase verifications VM by using the number-of-erase-verifications setting unit (S10), the number of writes/erasures W/E is incremented by 1 (S11).

On the other hand, in the case of failing in an erase verification check (S6), the number of executions of an erase verification VC is incremented by 1 by using the number-of-erase-verifications counting unit 7c (S7). Then, an erase operation and an erase verify operation of the block Bi are repeated until passing an erase verification check.

On the other hand, when the number of executions of an erase verification VC is smaller than the predetermined number of erase verifications VM (S8), the number of executions of an erase verification VC is incremented by 1 (S7). Then, an erase operation, an erase verify operation, and an erase verification check of the block Bi are repeated until the number of executions of an erase verification VC becomes equal to or more than the predetermined number of erase verifications VM.

Figure 8:
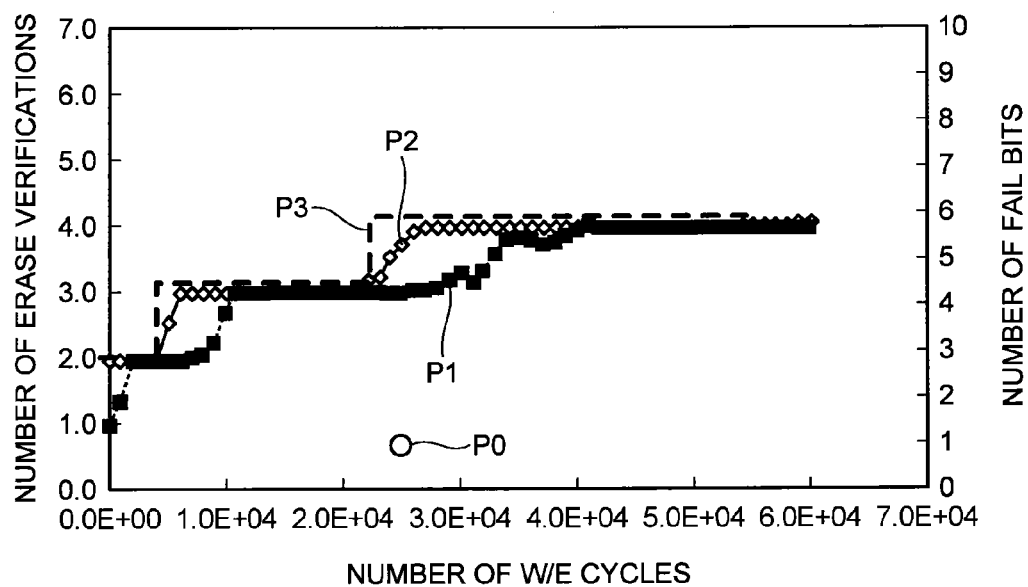
FIG. 8 is a diagram illustrating a relationship between the number of write/erase cycles and the number of erase verifications of the nonvolatile semiconductor memory device in FIG. 1.

FIG. 8 is a diagram illustrating a relationship between the number of write/erase cycles and the number of erase verifications of the nonvolatile semiconductor memory device in FIG. 1. P0 indicates a fail bit, P1 indicates the number of erase verifications when the number of memory cells that store '1' is large in the column direction, P2 indicates the number of erase verifications when the number of memory cells that store '1' is small in the column direction, and P3 indicates the minimum number of erase verifications from the next time set by the number-of-erase-verifications setting unit 7d in FIG. 1.

In FIG. 8, in the case where erasing is performed for each block Bi, when the number of memory cells that store '1' becomes large in the column direction, the cell current Ice that flows at the time of an erase verification increases. Therefore, the potential of the bit line BLj at the time of an erase verification reaches the erase verification voltage Vf in a shorter time than expected, and even if erasing of the cell transistors MT1 to MTp is incomplete, memory cells are determined to pass an erase verification and the fail bit P0 is generated.

For example, in the case of the pattern of P1, even if erasing of the cell transistors MT1 to MTp is incomplete, memory cells are determined to pass an erase verification check in the third erase verification and the fail bit P0 is generated. At this time, it is possible to set the minimum number of erase verifications from the next time to four before the fail bit P0 is generated as shown in the pattern of P3 by providing the number-of- erase-verifications setting unit 7d in FIG. 1. Therefore, in the case of the pattern of P1, even when memory cells are determined to pass an erase verification check in the third erase verification, an erase verification can be performed four times, so that erase failure can be reduced.

In the above-described first embodiment, explanation is made for the method of setting the minimum number of erase verifications to the NAND cell units of all of the blocks B1 to Bn in common, however, the current number of erase verifications of each of the blocks B1 to Bn may be counted individually and the minimum number of erase verifications may be set individually for each of the blocks B1 to Bn.

Consequently, it is possible to prevent the blocks B1 to Bn having a poor erase performance from placing unnecessary stress on the blocks B1 to Bn having an excellent erase performance, so that even when the erase performance varies between the blocks B1 to Bn, erase failure can be reduced while suppressing increase in stress at the time of erasing.

(Second Embodiment)

Figure 9:
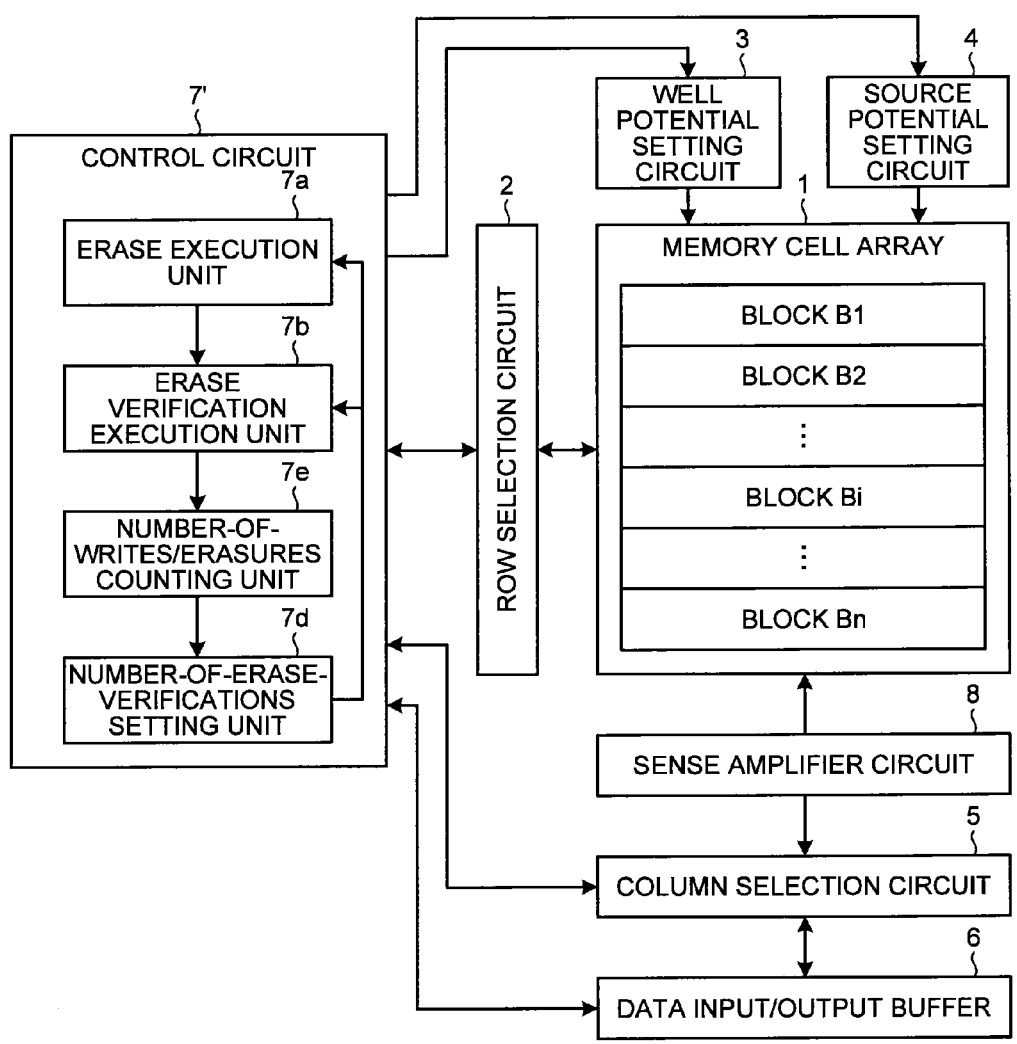
FIG. 9 is a block diagram illustrating a schematic configuration of a nonvolatile semiconductor memory device according to a second embodiment.

FIG. 9 is a block diagram illustrating a schematic configuration of a nonvolatile semiconductor memory device according to the second embodiment.

In FIG. 9, in this nonvolatile semiconductor memory device, a control circuit 7' is provided instead of the control circuit 7 in FIG. 1. The control circuit 7' includes a number-of-writes/erasures counting unit 7e instead of the number-of-erase-verifications counting unit 7c in FIG. 1. The number-of-writes/erasures counting unit 7e can count the number of writes/erasures of memory cells of the memory cell array 1.

Then, in the number-of-writes/erasures counting unit 7e, the number of writes/erasures of memory cells of the memory cell array 1 is counted. Then, in the number-of-erase-verifications setting unit 7d, the minimum number of erase verifications from the next time is set based on the number of writes/erasures counted by the number-of-writes/erasures counting unit 7e.

Then, in the erase execution unit 7a and the erase verification execution unit 7b, even when there are memory cells that pass an erase verification in the number of times less than the number of erase verifications set by the number-of-erase-verifications setting unit 7d, an erase operation and an erase verify operation are performed for the number of erase verifications set by the number-of-erase-verifications setting unit 7d.

Consequently, even when the pattern of P1 in FIG. 8 is written in the memory cell array 1 permanently, an erase operation and an erase verify operation can be performed for the number of erase verifications set by the number-of-erase-verifications setting unit 7d, so that even when the number of erase verifications increases with degradation of a tunnel oxide film or the like, erase failure can be reduced while suppressing increase in stress at the time of erasing.

In the above-described second embodiment, explanation is made for the method of setting the minimum number of erase verifications to the NAND cell units of all of the blocks B1 to Bn in common, however, the number of writes/erasures of each of the blocks B1 to Bn may be counted individually and the minimum number of erase verifications may be set individually for each of the blocks B1 to Bn.

Figure 10:
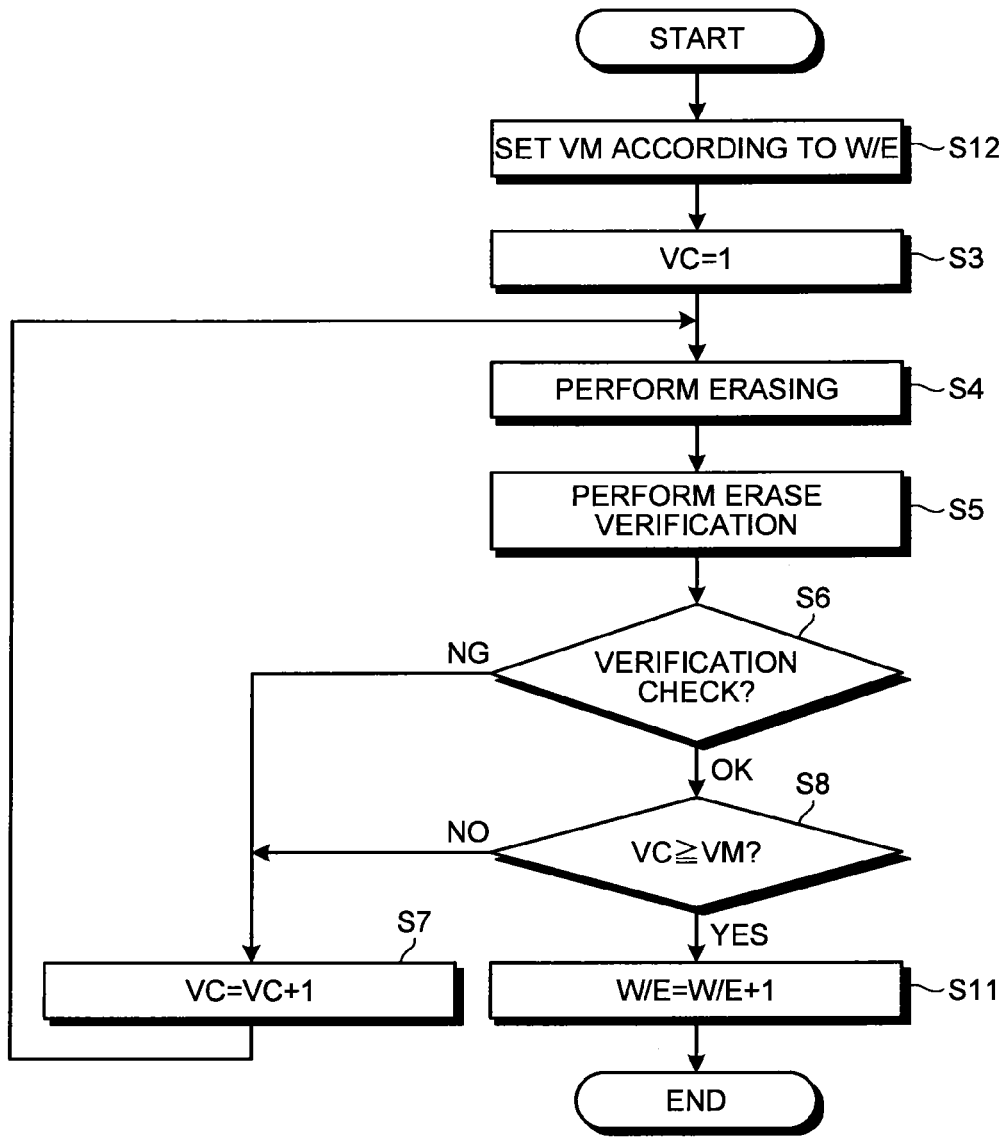
FIG. 10 is a flowchart illustrating an erase verify operation of the nonvolatile semiconductor memory device in FIG. 9.

FIG. 10 is a flowchart illustrating an erase verify operation of the nonvolatile semiconductor memory device in FIG. 9.

In FIG. 10, after the predetermined number of erase verifications VM is set according to the number of writes/erasures W/E by using the number-of-erase-verifications setting unit 7d (S12), the number of executions of an erase verification VC is set to 1 (S3). The predetermined number of erase verifications VM, for example, can be set as follows:

$$0 \le W/E < E1 \rightarrow VM = a \text{ (}a\text{ is a positive integer)}$$
$$E1 \le W/E < E2 \rightarrow VM = a+1$$
$$E2 \le W/E < E3 \rightarrow VM = a+2$$
$$\vdots$$
$$En \le W/E \rightarrow VM = a+n \text{ (}n\text{ is a positive integer)}$$

where E1 to En are integers satisfying the condition of E1<E2<...<En.

Next, after an erase operation of the block Bi in FIG. 9 is performed (S4), an erase verify operation is performed (S5). Then, in the case of passing an erase verification check (S6), the number of executions of an erase verification VC is compared with the predetermined number of erase verifications VM. Then, when the number of executions of an erase verification VC is equal to or more than the predetermined number of erase verifications VM (S8), the number of writes/erasures W/E is incremented by 1 by using the number-of-writes/erasures counting unit 7e (S11).

On the other hand, in the case of failing in an erase verification check (S6), the number of executions of an erase verification VC is incremented by 1 (S7). Then, an erase operation and an erase verify operation of the block Bi are repeated until passing an erase verification check.

On the other hand, when the number of executions of an erase verification VC is smaller than the predetermined number of erase verifications VM (S8), the number of executions of an erase verification VC is incremented by 1 (S7). Then, an erase operation, an erase verify operation, and an erase verification check of the block Bi are repeated until the number of executions of an erase verification VC becomes equal to or more than the predetermined number of erase verifications VM.

(Third Embodiment)

Figure 11:
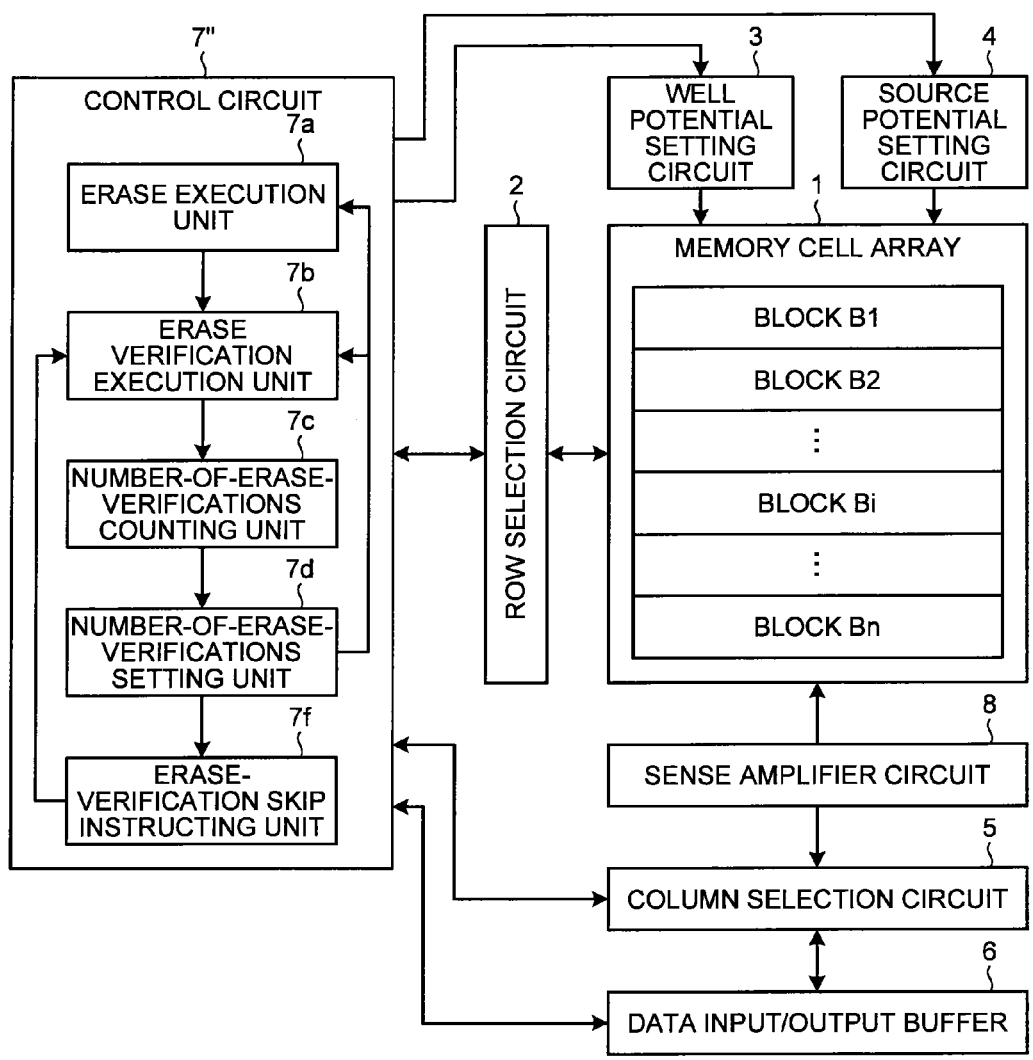
FIG. 11 is a block diagram illustrating a schematic configuration of a nonvolatile semiconductor memory device according to a third embodiment.

FIG. 11 is a block diagram illustrating a schematic configuration of a nonvolatile semiconductor memory device according to the third embodiment.

In FIG. 11, in this nonvolatile semiconductor memory device, a control circuit 7" is provided instead of the control circuit 7 in FIG. 1. In the control circuit 7", an erase-verification skip instructing unit 7f is added to the control circuit 7 in FIG. 1. The erase-verification skip instructing unit 7f can make an erase verification operation to be skipped in the case of less than the number of erase verifications set by the number-of-erase-verifications setting unit 7d.

Then, in the number-of-erase-verifications counting unit 7c, the number of erase verifications of memory cells, on which an erase operation is performed, is counted. Then, in the number-of-erase-verifications setting unit 7d, the current number of erase verifications counted by the number-of-erase-verifications counting unit 7c is set as the minimum number of erase verifications from the next time.

Then, in the erase execution unit 7a, an erase operation is performed for the number of erase verifications set by the number-of-erase-verifications setting unit 7d, and in the erase verification execution unit 7b, an erase verify operation is skipped in the case of less than the number of erase verifications set by the number-of-erase-verifications setting unit 7d.

Consequently, an erase operation can be performed for the number of erase verifications set by the number-of-erase-verifications setting unit 7d wile reducing the number of erase verify operations, and erase failure can be reduced and time needed for erasing can be shortened while suppressing increase in stress at the time of erasing.

In the above-described third embodiment, explanation is made for the method of setting the minimum number of erase verifications to the NAND cell units of all of the blocks B1 to Bn in common, however, the current number of erase verifications of each of the blocks B1 to Bn may be counted individually and the minimum number of erase verifications may be set individually for each of the blocks B1 to Bn.

Moreover, in the above-described third embodiment, the method of setting the current number of erase verifications as the minimum number of erase verifications from the next time is explained, however, the minimum number of erase verifications from the next time can be set based on the number of writes/erasures of memory cells of the memory cell array 1.

Figure 12:
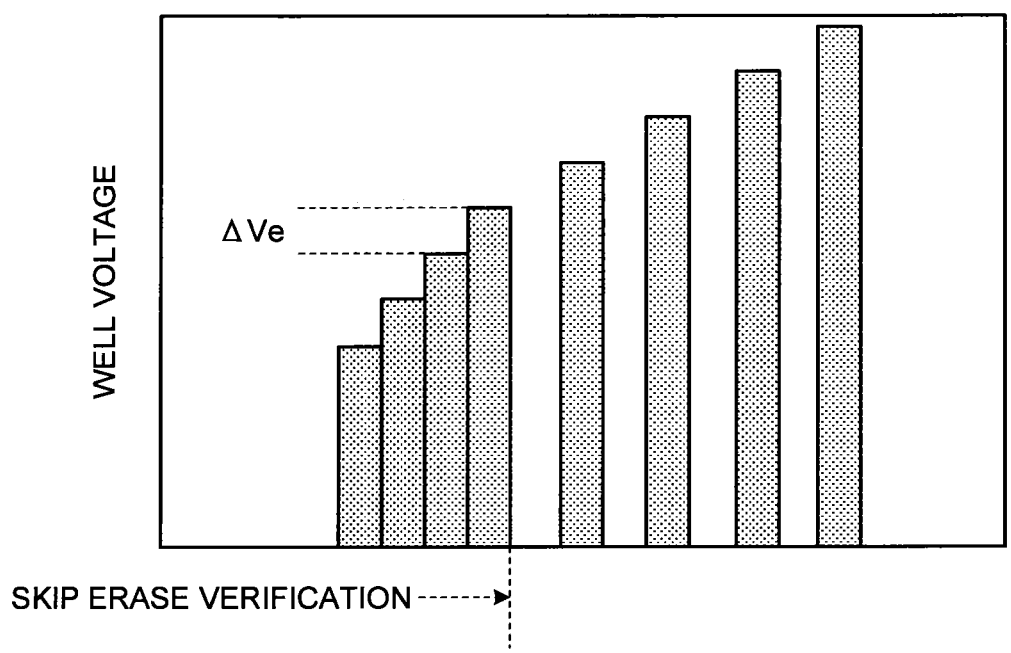
FIG. 12 is a diagram illustrating a relationship between the number of erase verifications and a well voltage of the nonvolatile semiconductor memory device in FIG. 11.

FIG. 12 is a diagram illustrating a relationship between the number of erase verifications and a well voltage of the nonvolatile semiconductor memory device in FIG. 11.

In FIG. 12, an erase operation is performed continuously for the number of erase verifications set by the number-of-erase-verifications setting unit 7d in FIG. 11. At this time, an erase verify operation is skipped in the case of less than the number of erase verifications set by the number-of-erase-verifications setting unit 7d. Moreover, in an erase operation, the erase voltage Ve is increased by the difference voltage ΔVe every time an erase operation is performed once.

Figure 13:
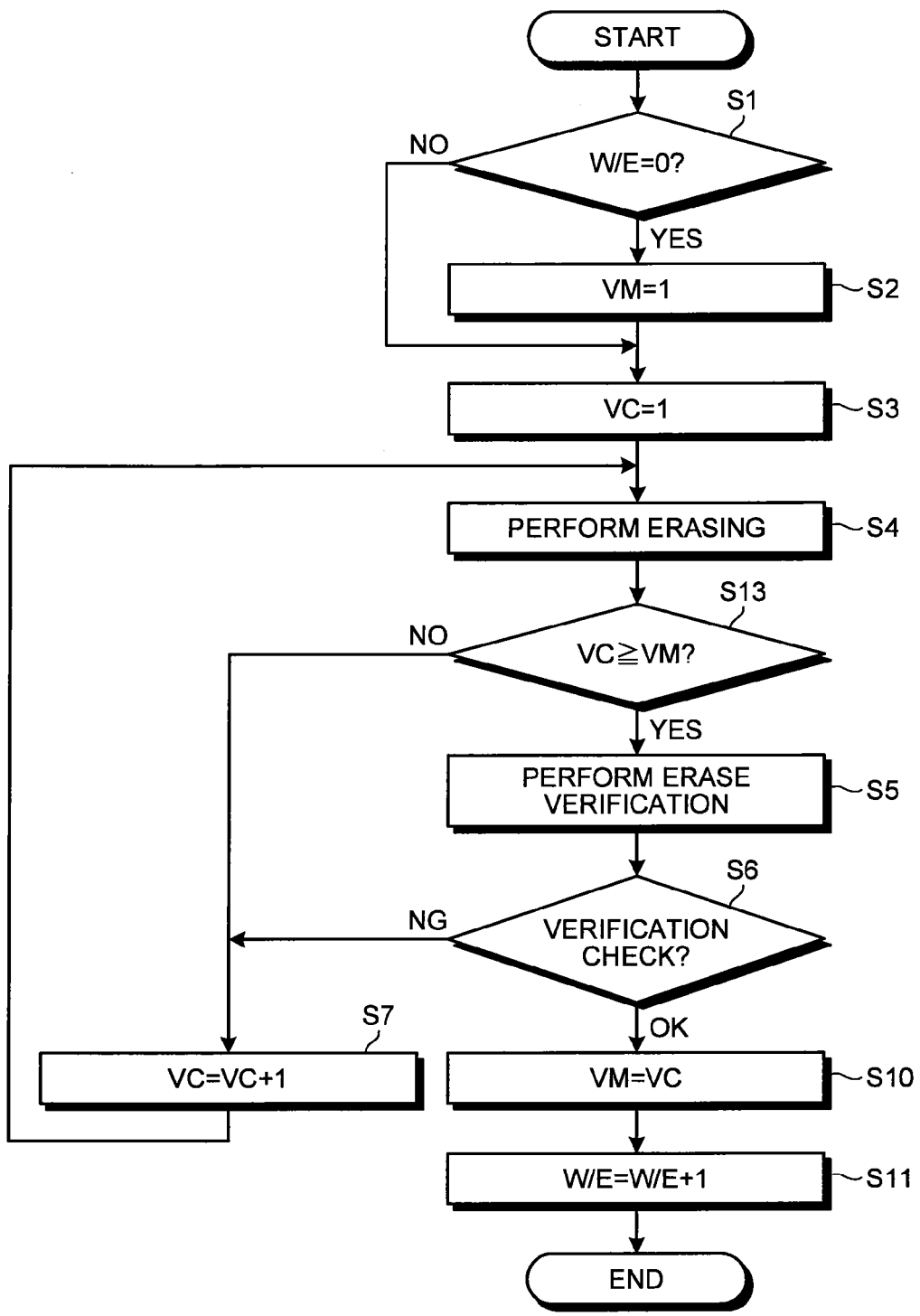
FIG. 13 is a flowchart illustrating an erase verify operation of the nonvolatile semiconductor memory device in FIG. 11.

FIG. 13 is a flowchart illustrating an erase verify operation of the nonvolatile semiconductor memory device in FIG. 11.

In FIG. 13, when the number of writes/erasures W/E is 0 (S1), after the predetermined number of erase verifications VM is set to 1 (S2), the number of executions of an erase verification VC is set to 1 (S3). On the other hand, when the number of writes/erasures W/E is 1 or more (S1), the number of executions of an erase verification VC is set to 1 (S3).

Next, after an erase operation of the block Bi in FIG. 11 is performed (S4), the number of executions of an erase verification VC is compared with the predetermined number of erase verifications VM by using the erase-verification skip instructing unit 7f (S13). Then, when the number of executions of an erase verification VC is equal to or more than the predetermined number of erase verifications VM, an erase verify operation is performed (S5). Then, in the case of passing an erase verification check (S6), after the number of executions of an erase verification VC is set to the predetermined number of erase verifications VM (S10), the number of writes/erasures W/E is incremented by 1 (S11).

On the other hand, in the case of failing in an erase verification check (S6), the number of executions of an erase verification VC is incremented by 1 (S7). Then, an erase operation and an erase verify operation of the block Bi are repeated until passing an erase verification check.

On the other hand, when the number of executions of an erase verification VC is smaller than the predetermined number of erase verifications VM (S13), the number of executions of an erase verification VC is incremented by 1 (S7). Then, an erase operation of the block Bi is repeated until the number of executions of an erase verification VC becomes equal to or more than the predetermined number of erase verifications VM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell array in which a plurality of memory cells is provided;
   an erase execution unit that performs an erase operation of data stored in the memory cells;
   an erase verification execution unit that performs an erase verify operation of a memory cell, on which the erase operation is performed;
   a number-of-erase-verifications counting unit that counts a number of erase verifications of a memory cell on which the erase operation is performed; and
   a number-of-erase-verifications setting unit that sets a minimum number of erase verifications for a next time based on the current number of erase verifications counted by the number-of-erase-verifications counting unit.

2. The nonvolatile semiconductor memory device according to claim 1, wherein
   the memory cell array includes m (m is a positive integer) number of NAND cell units arrayed in a row direction, and
   the NAND cell unit includes
      a NAND string including 1 (1 is a positive integer) number of cell transistors sequentially connected in series,
      a first select transistor connected to one end of the NAND string in series, and
      a second select transistor connected to another end of the NAND string in series.

3. The nonvolatile semiconductor memory device according to claim 2, wherein the memory cell array includes 1 number of word lines provided for each row to be shared by cell transistors in the same row, and wherein one block includes the m number of NAND cell units, and n (n is a positive integer) number of the blocks are provided in a column direction.

4. The nonvolatile semiconductor memory device according to claim 1, wherein the erase verification execution unit, even when there is a memory cell that passes an erase verification in a number of times less than the number of erase verifications set by the number-of-erase-verifications setting unit, performs an erase verify operation for the number of erase verifications set by the number-of-erase-verifications setting unit.

5. The nonvolatile semiconductor memory device according to claim 1, wherein the number-of-erase-verifications setting unit sets a minimum number of erase verifications from the next time in a block unit.

6. The nonvolatile semiconductor memory device according to claim 1, wherein, when the number of erase verifications in a X-th (X is a positive integer) write/erase cycle is A (A is a positive integer), and the number of erase verifications in a (X+1)th write/erase cycle is B (B is an integer larger than A), a minimum number of erase verifications from a (X+2)th write/erase cycle is set to B.

7. The nonvolatile semiconductor memory device according to claim 5, wherein, in a case of failing in an erase verification check, the number of erase verifications performed by the erase verification execution unit is incremented by one, and an erase operation and an erase verify operation of the block are repeated until passing the erase verification check.

8. The nonvolatile semiconductor memory device according to claim 5, wherein, when the number of erase verifications performed by the erase verification execution unit is less than the number of erase verifications set by the number-of-erase-verifications setting unit, the number of erase verifications performed by the erase verification execution unit is incremented by one and an erase operation, an erase verify operation, and an erase verification check of the block are repeated until the number of erase verifications performed by the erase verification execution unit becomes equal to or more than the number of erase verifications set by the number-of-erase-verifications setting unit.

9. The nonvolatile semiconductor memory device according to claim 1, further comprising an erase-verification skip instructing unit that skips an erase verify operation in a case of the number of erase verifications being less than the number of erase verifications set by the number-of-erase-verifications setting unit and makes the erase verification execution unit to perform an erase verify operation in a case of the number of erase verifications being equal to or more than the number of erase verifications set by the number-of-erase-verifications setting unit.

10. The nonvolatile semiconductor memory device according to claim 1, wherein when the erase execution unit applies a first voltage pulse for a well potential of the memory cell array in the erase operation of the memory cells, the erase execution unit steps up the first voltage pulse a number of times which is one lower than the minimum number of erase verifications set by the number-of-erase-verifications setting unit.

11. A nonvolatile semiconductor memory device comprising:
   a memory cell array in which a plurality of memory cells is provided;
   an erase execution unit that performs an erase operation of data stored in the memory cells;
   an erase verification execution unit that performs an erase verify operation of a memory cell, on which the erase operation is performed;
   a number-of-writes/erasures counting unit that counts a number of writes/erasures of the memory cells; and
   a number-of-erase-verifications setting unit that sets a minimum number of erase verifications for a next time based on the number of writes/erasures counted by the number-of-writes/erasures counting unit.

12. The nonvolatile semiconductor memory device according to claim 11, wherein
the memory cell array includes m (m is a positive integer) number of NAND cell units arrayed in a row direction, and
the NAND cell unit includes
a NAND string including l (l is a positive integer) number of cell transistors sequentially connected in series,
a first select transistor connected to one end of the NAND string in series, and
a second select transistor connected to another end of the NAND string in series.

13. The nonvolatile semiconductor memory device according to claim 12, wherein the memory cell array includes l number of word lines provided for each row to be shared by cell transistors in same row, and wherein
one block includes the m number of NAND cell units, and
n (n is a positive integer) number of the blocks are provided in a column direction.

14. The nonvolatile semiconductor memory device according to claim 11, wherein the erase verification execution unit, even when there is a memory cell that passes an erase verification in the number of times less than the number of erase verifications set by the number-of-erase-verifications setting unit, performs an erase verify operation for the number of erase verifications set by the number-of-erase-verifications setting unit.

15. The nonvolatile semiconductor memory device according to claim 11, wherein the number-of-erase-verifications setting unit sets a minimum number of erase verifications for a next time in a block unit.

16. The nonvolatile semiconductor memory device according to claim 11, wherein the number of erase verifications VM set by the number-of-erase-verifications setting unit is set as follows:

$$0 \le W/E < E1 \quad \rightarrow \quad VM = a \; (a \text{ is a positive integer})$$
$$E1 \le W/E < E2 \quad \rightarrow \quad VM = a + 1$$
$$E2 \le W/E < E3 \quad \rightarrow \quad VM = a + 2$$
$$\vdots$$
$$En \le W/E \quad \rightarrow \quad VM = a + n \; (n \text{ is a positive integer})$$

where E1 to En are integers satisfying a condition E1<E2< ... <En, and W/E is the number of writes/erasures.

17. The nonvolatile semiconductor memory device according to claim 15, wherein, in a case of failing in an erase verification check, the number of erase verifications performed by the erase verification execution unit is incremented by one, and an erase operation and an erase verify operation of the block are repeated until passing the erase verification check.

18. The nonvolatile semiconductor memory device according to claim 15, wherein, when the number of erase verifications performed by the erase verification execution unit is less than the number of erase verifications set by the number-of-erase-verifications setting unit, the number of erase verifications performed by the erase verification execution unit is incremented by one and an erase operation, an erase verify operation, and an erase verification check of the block are repeated until the number of erase verifications performed by the erase verification execution unit becomes equal to or more than the number of erase verifications set by the number-of-erase-verifications setting unit.

19. The nonvolatile semiconductor memory device according to claim 11, further comprising an erase-verification skip instructing unit that skips an erase verify operation in a case of the number of erase verifications being less than the number of erase verifications set by the number-of-erase-verifications setting unit and makes the erase verification execution unit to perform an erase verify operation in a case of the number of erase verifications being equal to or more than the number of erase verifications set by the number-of-erase-verifications setting unit.

* * * * *